(12) United States Patent
Chen et al.

(10) Patent No.: US 11,855,637 B2
(45) Date of Patent: Dec. 26, 2023

(54) RING OSCILLATOR

(71) Applicant: CHANGXIN MEMORY TECHNOLOGIES, INC., Hefei (CN)

(72) Inventors: Chan Chen, Hefei (CN); Anping Qiu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/855,850

(22) Filed: Jul. 1, 2022

(65) Prior Publication Data

US 2023/0253958 A1 Aug. 10, 2023

Related U.S. Application Data

(63) Continuation of application No. PCT/CN2022/076609, filed on Feb. 17, 2022.

(30) Foreign Application Priority Data

Feb. 10, 2022 (CN) .......................... 202210125871.0

(51) Int. Cl.
*H03K 3/03* (2006.01)
*H03K 5/01* (2006.01)
*H03K 3/037* (2006.01)
*H03K 19/20* (2006.01)
*H03K 5/00* (2006.01)

(52) U.S. Cl.
CPC .......... *H03K 3/0315* (2013.01); *H03K 3/037* (2013.01); *H03K 5/01* (2013.01); *H03K 19/20* (2013.01); *H03K 2005/00013* (2013.01)

(58) Field of Classification Search
CPC ......... H03K 2005/00013; H03K 19/20; H03K 5/01; H03K 5/037; H03K 3/0315
USPC .................................. 331/57, 2, 46
See application file for complete search history.

(56) References Cited

U.S. PATENT DOCUMENTS 4,560,954 A * 12/1985 Leach .................... H03K 3/014
327/295
6,870,431 B2 * 3/2005 Afghahi ............... H03K 3/0315
331/46
7,707,469 B2   4/2010 Lee
(Continued)

FOREIGN PATENT DOCUMENTS

CN       103378826 A     10/2013
CN       103780257 A     5/2014
(Continued)

*Primary Examiner* — Arnold M Kinkead
(74) *Attorney, Agent, or Firm* — Cooper Legal Group, LLC

(57) ABSTRACT

A ring oscillator includes an oscillation module, a first delay module, and a second delay module. The oscillation module is disposed in a first delay loop and a second delay loop and includes a first number of latches connected in series. The oscillation module has two input ends and two output ends, and the two input ends are respectively connected to a first node and a second node. The first delay module is disposed in the first delay loop and has an input end connected to a first output end of the oscillation module and an output end connected to the first node. The second delay module is disposed in the second delay loop and has an input end connected to a second output end of the oscillation module and an output end connected to the second node.

20 Claims, 7 Drawing Sheets

(56) References Cited

U.S. PATENT DOCUMENTS

| | | | |
|---|---|---|---|
| 8,183,939 B1 * | 5/2012 | Kumar | H03K 3/0315 |
| | | | 331/185 |
| 8,804,448 B2 | 8/2014 | Park | |
| 2005/0007835 A1 | 1/2005 | Lee | |
| 2005/0226080 A1 | 10/2005 | Lee | |
| 2006/0262611 A1 | 11/2006 | Lee | |
| 2007/0204185 A1 | 8/2007 | Ogura | |
| 2007/0291575 A1 | 12/2007 | Lee | |
| 2008/0052571 A1 | 2/2008 | Lee | |
| 2009/0059680 A1 | 3/2009 | Lee | |
| 2009/0122850 A1 | 5/2009 | Lee | |
| 2010/0054053 A1 | 3/2010 | Lee | |
| 2011/0102091 A1 | 5/2011 | Yeric | |
| 2012/0239337 A1 | 9/2012 | Matsuo | |
| 2013/0049875 A1 | 2/2013 | Shiga | |
| 2013/0271196 A1 | 10/2013 | Cao | |
| 2013/0286759 A1 | 10/2013 | Park | |
| 2014/0298125 A1 | 10/2014 | Devadze et al. | |
| 2015/0016200 A1 | 1/2015 | Cha et al. | |
| 2015/0084668 A1 | 3/2015 | Yun | |
| 2019/0052268 A1 | 2/2019 | Lee et al. | |

FOREIGN PATENT DOCUMENTS

| | | | |
|---|---|---|---|
| CN | 104113331 A | 10/2014 | |
| CN | 102072781 B | 2/2015 | |
| CN | 106330149 A | 1/2017 | |
| CN | 106372539 A | 2/2017 | |
| CN | 107393576 A | 11/2017 | |
| CN | 109390011 A | 2/2019 | |
| JP | 2009026359 A | 2/2009 | |

* cited by examiner

RING OSCILLATOR

CROSS-REFERENCE TO RELATED APPLICATIONS

This application is a continuation of International Application No. PCT/CN2022/076609, filed on Feb. 17, 2022, which claims priority to Chinese Patent Application No. 202210125871.0, filed on Feb. 10, 2022. The disclosures of International Application No. PCT/CN2022/076609 and Chinese Patent Application No. 202210125871.0 are hereby incorporated by reference in their entireties.

BACKGROUND

In a circuit, a ring oscillator structure is generally used to measure a speed of the device. The ring oscillator structure is usually a number of inverters connected in series, and an output end of the last inverter is connected with an input end of the first inverter. During measurement, a delay of the delay circuit is generally estimated by measuring a period value of an output waveform of the last inverter, using the formula tPD=T/(2N), where tPD is an average delay of individual inverters, T is the period value of the output waveform, and N is a number of stages of the ring oscillator, that is, the quantity of inverters connected in series.

This ring oscillator structure is valid for measuring common gate delay circuits. However, for some special delay circuits, such as single-edge delay circuits, the sensitivity is not high, and a value of the single-edge delay cannot be measured.

It is to be noted, the information disclosed above in the background section is only used to enhance the understanding of the background of the present disclosure, therefore it may include information that does not form a prior art already known to a person of ordinary skill in the art.

SUMMARY

The present disclosure relates to the technical field of electronic circuits, and specifically, to a ring oscillator.

The present disclosure are intended to provide a ring oscillator that is used to at least partially overcome the problems of insufficient measurement accuracy of the ring oscillator structure and inability to measure the value of the single-edge delay due to the limitations and defects of the related art.

According to a first aspect of the present disclosure, there is provided a ring oscillator having a first delay loop and a second delay loop, an output end of the first delay loop being connected to a first node and an output end of the second delay loop being connected to a second node, the ring oscillator including: an oscillation module, disposed in the first delay loop and the second delay loop and including a first number of latches connected in series, where the oscillation module has two input ends and two output ends, and the two input ends are respectively connected to the first node and the second node; a first delay module, disposed in the first delay loop, and having an input end connected to a first output end of the oscillation module and an output end connected to the first node; and a second delay module, disposed in the second delay loop, and having an input end connected to a second output end of the oscillation module and an output end connected to the second node, where a structure of the second delay module is identical to a structure of the first delay module.

It is to be understood that the general description above and the following detailed description are exemplary and explanatory only, and are not intended to limit the present disclosure.

BRIEF DESCRIPTION OF THE DRAWINGS

The accompanying drawings are incorporated in the specification and constitute a part of the specification, and the accompanying drawings illustrate embodiments consistent with the disclosure and serve to explain the principles of the disclosure with the specification. Apparently, the drawings in the following description are only some embodiments of the present disclosure, and those of ordinary skill in the art can obtain other drawings from these drawings without creative working.

DETAILED DESCRIPTION

Figure 1:
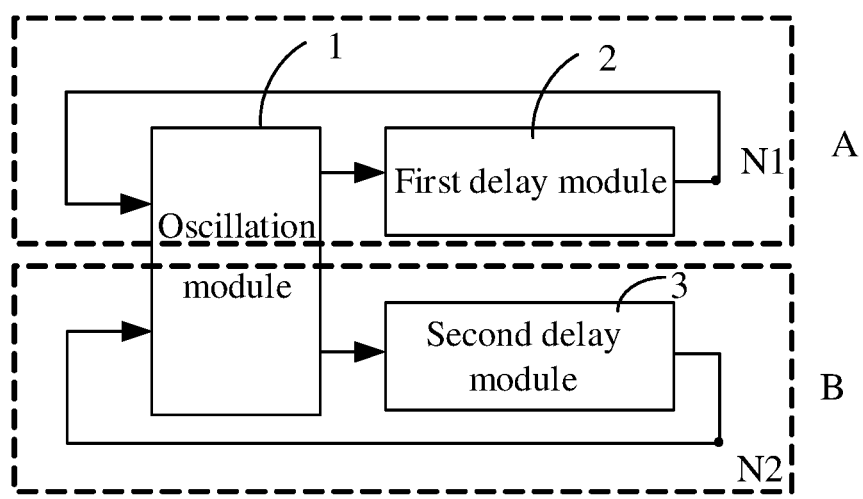
FIG. 1 is a schematic structural diagram of a ring oscillator according to an exemplary embodiment of the present disclosure.

Example embodiments will now be described more fully with reference to the accompanying drawings. However, example embodiments can be embodied in various forms and should not be construed as limited to the examples set forth herein. On the contrary, these embodiments are provided so that this disclosure will be thorough and complete, and the concept of example embodiments to those skilled in the art will be fully conveyed. The described features, structures, or characteristics may be combined in any suitable manner in one or more embodiments. In the following description, numerous specific details are provided in order to give a thorough understanding of the embodiments of the present disclosure. However, those skilled in the art will appreciate that the technical solutions of the present disclosure may be practiced without one or more of the specific details, or other methods, components, devices, steps, etc. may be employed. In other instances, well-known technical solutions have not been shown or described in detail to avoid obscuring aspects of the present disclosure.

Furthermore, the drawings are only schematic illustrations of the present disclosure, the same reference numerals in the drawings denote the same or similar parts, and thus their repeated descriptions will be omitted. Some of the block diagrams shown in the figures are functional entities that do not necessarily correspond to physically or logically separate entities. These functional entities may be implemented in software, or in one or more hardware modules or integrated circuits, or in different networks and/or processor devices and/or microcontroller devices.

The exemplary embodiments of the present disclosure will be described in detail below with reference to the accompanying drawings.

FIG. 1 is a schematic structural diagram of a ring oscillator according to an exemplary embodiment of the present disclosure.

Referring to FIG. 1, the ring oscillator 100 may have a first delay loop A and a second delay loop B, where the output end of the first delay loop A is connected to the first node N1, and the output end of the second delay loop B is connected to the second node N2. The ring oscillator 100 includes:

an oscillation module 1, disposed in the first delay loop A and the second delay loop B and including a first number of latches connected in series, where the oscillation module has two input ends and two output ends, and the two input ends are respectively connected to the first node N1 and the second node N2;

a first delay module 2, disposed in the first delay loop A, and having an input end connected to a first output end of the oscillation module 1 and an output end connected to the first node N1;

a second delay module 3, disposed in the second delay loop B, and having an input end connected to a second output end of the oscillation module 1 and an output end connected to the second node N2, where a structure of the second delay module 3 is identical to a structure of the first delay module 2.

In the embodiment shown in FIG. 1, a fundamental oscillation circuit of the ring oscillator 100 is formed by connecting a first number of latches in series, so as to generate a base signal and make the base signal to be input to the first delay module 2 and the second delay module 3 through the two output ends of the oscillation module 1 respectively, thereby forming respective oscillating signals. The delay times of the first delay module 2 and the second delay module 3 can be calculated according to the periods of the oscillation signals.

When the latches connected in series are used to generate a base signal, the input signals at the two input ends of the oscillation module 1 are inverse to each other, and the output signals at the two output ends are inverse to each other. The output signals are inverse to each other, that is, when an input end jumps to a low level, the other end jumps to a high level, therefore the delay of the oscillation module 1 can be constrained to a minimum value of the rising edge delay and the falling edge delay. In turn, the ratios of the rising edge delay and the falling edge delay of the oscillation module 1 to the period of the oscillation signal can be reduced, and it is thus beneficial to accurately measure the delays of the first delay module 2 and the second delay module 3. In addition, by setting the structure of the first delay module 2 to be the same as the structure of the second delay module 3, it is beneficial to obtain, through calculation, the average delay duration of the structure corresponding to the first delay module 2 by calculating an average value of the period of the oscillation signal at the first node N1 and the period of the oscillation signal at the second node N2 to reduce the influences due to delay parameter differences caused by process fluctuations. It should be emphasized that in the process of measuring the delay parameters of a single-edge delay circuit, since the periods of the oscillation signals at the first node N1 and the second node N2 both include not only a single-edge delay but also the delay of the oscillation module 1, if the delay of oscillation module 1 is not constrained to form a relatively definite value, the ratio of the single-edge delay to the output period cannot be calculated due to process fluctuations in the device manufacturing process, and thus the delay parameters of the single-edge delay circuit cannot be calculated.

The embodiment shown in FIG. 1 will be described in detail as follows.

Figure 2:
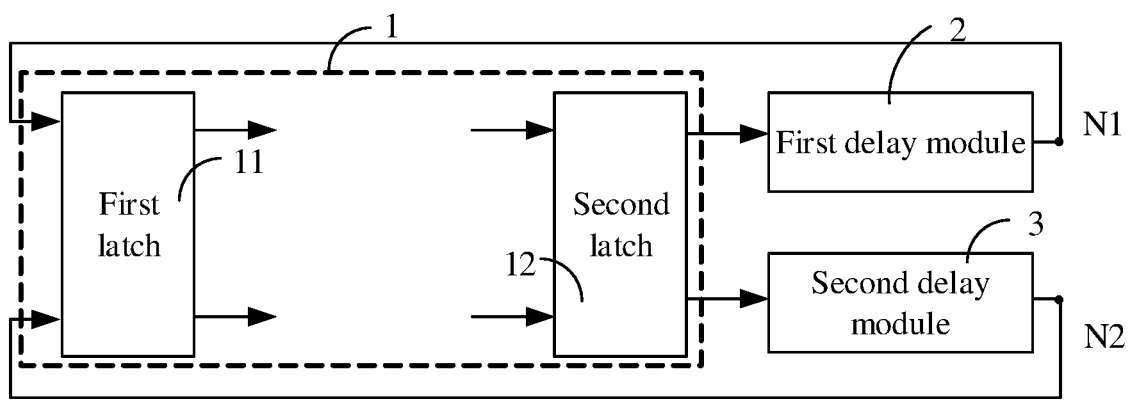
FIG. 2 is a schematic diagram of an oscillation module according to an embodiment of the present disclosure.

FIG. 2 is a schematic diagram of an oscillation module according to an embodiment of the present disclosure.

Referring to FIG. 2, in an exemplary embodiment of the present disclosure, a first number of latches connected in series include:

a first latch 11 having a first input end connected to the first node N1, a second input end connected to the second node N2, a first output end connected to a first input end of a next latch, and a second output end connected to a second input end of the next latch; and a second latch 12 having a first input end connected to a first output end of a previous latch, a second input end connected to a second output end of the previous latch, a first output end connected to the first delay module 2, and a second output end connected to the second delay module 3.

In an exemplary embodiment of the present disclosure, the first latch 11 and the second latch 12 are both SR latches. In addition, the first latch 11 and the second latch 12 may be both NAND latches, or may be both NOR latches. The present disclosure does not limit the types of latches, and it is only necessary to ensure that the first latch 11 and the second latch 12 are of the same type.

The basis for the oscillation module to form a oscillation signal is to invert the input signal. Therefore, when there are only a first number of latches connected in series in the oscillator module, the first number is an odd number. If there are other devices with signal inversion function, the first number can also be other values. The elements with signal inversion function include, but are not limited to, latches, NAND gates, NOR gates, NOT gates and other elements.

Figure 3:
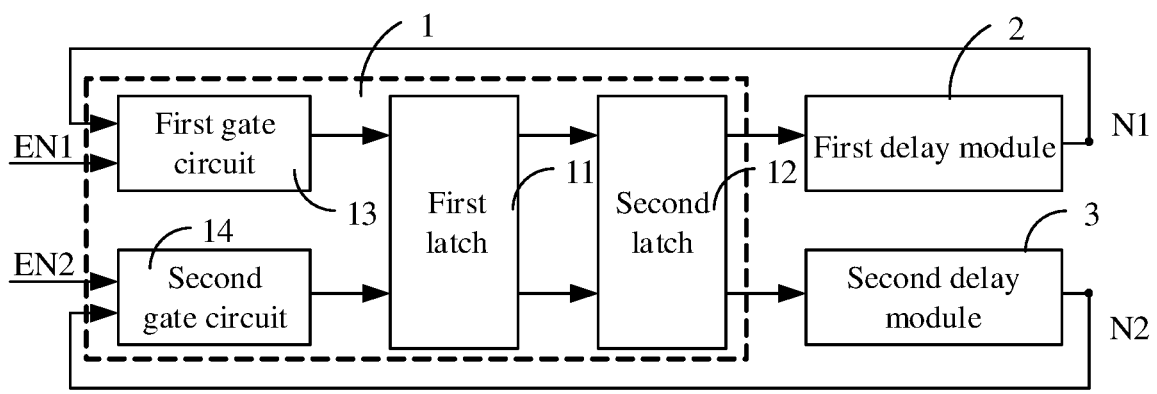
FIG. 3 is a schematic diagram of an oscillation module according to another embodiment of the present disclosure.

FIG. 3 is a schematic diagram of an oscillation module according to another embodiment of the present disclosure.

Referring to FIG. 3, in an exemplary embodiment of the present disclosure, the oscillation module 1 further includes:

a first gate circuit 13, disposed in the first delay loop A, and having a first input end connected to the first node N1, a second input end connected to a first enable signal EN1 and an output end connected to the first input end of the first latch 11, where the first gate circuit 13 is configured to output an inversion signal of a signal at the first node N1 when the first enable signal EN1 is in an enable state; and a second gate circuit 14, disposed in the second delay loop B, and having a first input end connected to the second node N2, a second input end connected to a second enable signal EN2 and an output end connected to the second input end of the first latch 11, where the second gate circuit 14 is configured to output an inversion signal of a signal at the second node N2 when the second enable signal EN2 is in an enable state.

In the embodiment of the present disclosure, one of the first gate circuit 13 or the second gate circuit 14 is an NAND gate and the other is an NOR gate; or, both the first gate circuit 13 and the second gate circuit 14 are NAND gates; or, both the first gate circuit 13 and the second gate circuit 14 are NOR gates.

In the embodiment shown in FIG. 3, since both the first delay loop A and the second delay loop B have an element with a signal inversion function, the first number of latches may be an even number. In an embodiment, the first number is equal to two. The first input end of the second latch 12 is connected to the first output end of the first latch 11. The second input end of the second latch 12 is connected to the second output end of the first latch 11.

By setting the enable signal of the oscillation module 1 to be input to the oscillation module 1 through an NAND gate and an NOR gate, it can be ensured that the internal state of the ring oscillator is stable when the ring oscillator does not work.

Different levels need to be input to two input ends of the latch, so that the latch can output an output signal that changes with the input signals. Taking the SR latch as an example, when the input end S is at a low level and the input end R is at a high level, the first output end outputs a low level, and the second output end outputs a high level. When both the input end S and the input end R are at the low level, the both output ends output the high level. And when the input end S and the input end R are both at the high level, the output state does not change.

Therefore, in the embodiments of the present disclosure, the first node N1 receives the first oscillation starting signal, and the second node N2 receives the second oscillation starting signal, where the first oscillation signal and the second oscillation signal are inverse to each other.

Taking the embodiment shown in FIG. 3 as an example. When the first oscillation starting signal is at a low level and the second oscillation starting signal is at a high level, the output end of the first gate circuit 13 outputs a high level, and the output end of the second gate circuit 14 outputs a low level, the two input ends of the first latch 11 receive a high level and a low level respectively, and the two output ends of the first latch 11 output a low level and a high level respectively. Similarly, the two input ends of the second latch 12 receive a low level and a high level respectively, and the two output ends output high level and low level respectively. Therefore, the input end of the first delay module 2 receives a low level or a high level, and the input signal is inverse to the first oscillation starting signal; the input end of the second delay module 3 receives a high level or a low level, and the input signal is inverse to the second oscillation starting signal, and the input signal is inverse to the input signal received by the first delay module 2.

In some embodiments, the structures of the first delay module 2 and the second delay module 3 are completely the same, and the first delay module 2 and the second delay module 3 both include an even number of inverters. Then the first delay module 2 is delayed to output the output signal (high level), which is inverse to the first oscillation starting signal, to the first node N1, and the second delay module 3 is delayed to output the output signal (low level), which is inverse to the second oscillation starting signal, to the second node N2. The input signals at the first gate circuit 13 and the second gate circuit 14 are inverse to the input signals in the last time, and the process returns to the conduction process of the last time.

As such, in the first delay loop A, the output signal at the first node N1 is monitored as high level, low level, high level, and low level. The transition period of high and low levels is determined by the total delay time of the first gate circuit 13, the first latch 11, the second latch 12 and the first delay module 2. Since the rising edge delay and falling edge delay of the latches are constrained, the ratio of the delay of the oscillation module 1 to a measurement result of the period can be reduced, the ratio of the delay of the first delay module 2 to the measurement result of the period can be increased, and the measurement accuracy of the delay parameters of the first delay module 2 can be improved.

It is to be understood, if the first delay module 2 is a rising edge delay circuit, the duration of the low level in the output oscillation signal is longer than the duration of the high level in the output oscillation signal. And because the low level duration is contributed by the first delay module 2 and the oscillation module 1 together, if the duration of the low level is directly used as the single-edge delay of the first delay module 2, the accuracy of the delay measurement is determined by the ratio of the single-edge delay to the duration of the low level, and the larger the ratio is, the higher the accuracy is.

The situation of the second delay loop B is exactly the opposite of the situation of the first delay loop A, and the output signal is inverse to the output signal as in the situation of the first delay loop A, which will not be repeated here. The reason why two delay loops are set is that the two input ends of the latch need to receive two levels inverse to each other at the same time. In addition, the final delay measurement result can also be determined subsequently according to the average value of the delay measurement results of the two delay loops, so as to improve the accuracy of the delay measurement.

Figure 4:
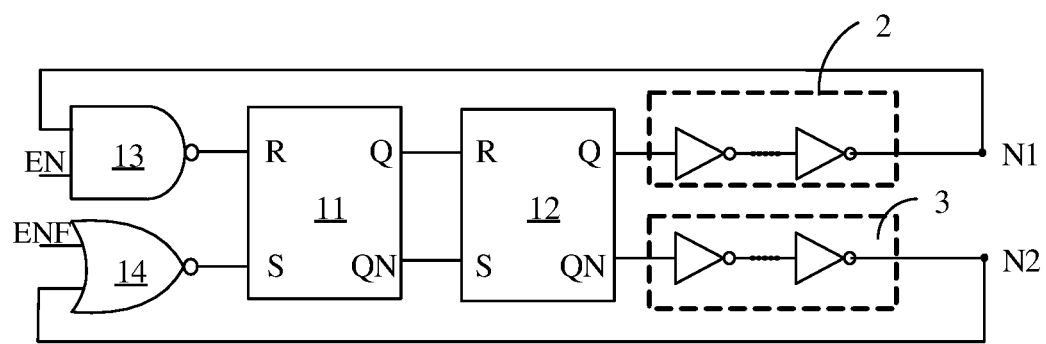
FIG. 4 is a schematic diagram of a first delay module and a second delay module according to an embodiment of the present disclosure.

FIG. 4 is a schematic diagram of a first delay module and a second delay module according to an embodiment of the present disclosure.

Referring to FIG. 4, in an exemplary embodiment of the present disclosure, the second number is equal to two, that is, both the first delay module 2 and the second delay module 3 are set with two inverters connected in series. The first gate circuit 13 is an NAND gate, the second gate circuit 14 is an NOR gate, and the first enable signal EN and the second enable signal ENF are inverse to each other.

In other embodiments of the present disclosure, both the first delay module 2 and the second delay module 3 may be a rising edge delay circuit, a falling edge delay circuit or a double-edge delay circuit. That is, the delay circuit tested by the ring oscillator can be in various forms, such as a double-edge delay circuit, a rising edge single-edge delay circuit, and a falling edge single-edge delay circuit.

Figure 5:
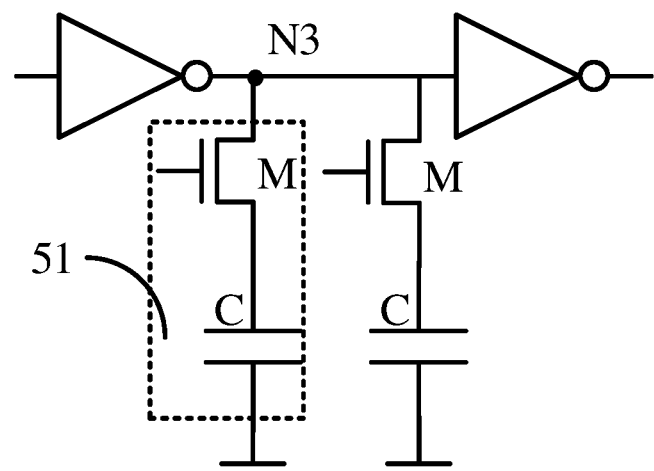
FIG. 5 is a schematic diagram of a delay module according to another embodiment of the present disclosure.

FIG. 5 is a schematic diagram of a delay module according to another embodiment of the present disclosure.

Referring to FIG. 5, in an embodiment, the first delay module 2 and the second delay module 3 both include one or more delay capacitor units 51, where the first end of each delay capacitor unit 51 is connected with an input end or output end of any inverter, the second end of each delay capacitor unit 51 is grounded, and each delay capacitor unit 51 at least includes a switch element M and a delay capacitor C connected in series.

It is to be understood that the number and the type of the delay capacitor units of the first delay module 2 need to be the same as those of the second delay module 3, to ensure the structure of the first delay module 2 is completely the same as the structure of the second delay module 3.

In the embodiment shown in FIG. 5, the first delay module 2 and the second delay module 3 can adjust the delay value by controlling the connection and disconnection of the delay capacitor units 51, and there is no need to add more inverters. The delay module shown in FIG. 5 is a falling edge single-edge delay circuit.

In the embodiment shown in FIG. 5, when the input signal of the first delay module 2 is at a low level and the switching element M in the delay capacitor unit 51 is turned on, the capacitor C discharges the third node N3 (an input end or output end of the inverter) to zero potential, which delays the speed at which the input end or output end of the inverter reaches zero potential, and delays the speed of the next inverter's output level inversion. When the input signal of the first delay module 2 is at a high level and the switch element M in the delay capacitor unit 51 is turned on, the current flowing through the input or output of the inverter charges the capacitor C through the third node N3, so as to make preparations for slowing down the potential drop speed of the third node N3 in the next time.

The number of delay capacitor units 51 connected to the first delay module 2 can be controlled by controlling the switching element M in each delay capacitor unit 51 to be turned on or off. The more the number of delay capacitor units 51 connected to the first delay module 2, the more the number of capacitors C that need to be charged and discharged, and the longer the delay. Since the structure of each delay capacitor unit 51 is the same, the capacitances of the capacitors C are the same, resulting in the same discharge time and the same charging time. Therefore, the delay value of the delay module can be controlled by controlling the number of connected delay capacitor units 51.

In addition, whether the delay module is a double edge delay module, a falling edge single-edge delay module or a rising edge single-edge delay module can also be determined by the positions of the delay capacitor units 51 in the delay module. The delay capacitor units 51 shown in FIG. 5 can slow down the falling speed of the level of the third node N3, that is, falling edge delay can be implemented. When there are an odd number of elements with signal inversion function between the delay capacitor unit 51 and the input signal, the delay capacitor unit 51 actually delays the rising edge of the input signal. When there are an even number of elements with signal inversion function between the delay capacitor unit 51 and the input signal, the delay capacitor unit 51 actually delays the falling edge of the input signal. Similarly, if the delay capacitor unit 51 is connected to each of an input end and an output end of an inverter, there must be a case where an even number of elements with signal inversion function are between a delay capacitor unit 51 and the input signal and where an odd number of elements with signal inversion function are between another delay capacitor unit 51 and the input signal. In this case, simultaneous delay of the rising edge and the falling edge of the input signal, that is, the double-edge delay. can be implemented.

The delay module's delay time of the rising edge and the falling edge of the input signal can be adjusted by adjusting the number of delay capacitor units 51 at different positions in the delay module.

In the embodiment shown in FIG. 5, by setting one or more delay capacitor units 51, the ratio of the delay of the delay module to the delay of the ring oscillator can be analyzed more accurately by adjusting the delay value of each delay module.

Figure 6:
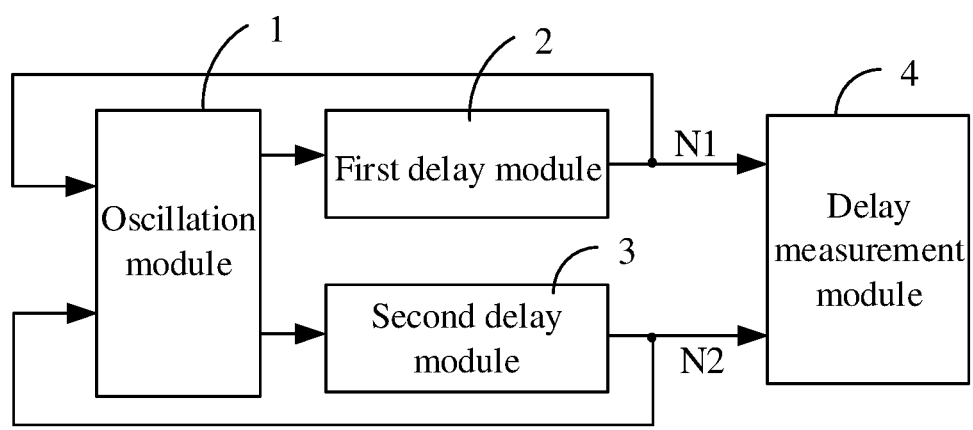
FIG. 6 is a schematic diagram of a ring oscillator according to another embodiment of the present disclosure.

FIG. 6 is a schematic diagram of a ring oscillator according to another embodiment of the present disclosure.

Referring to FIG. 6, in an exemplary embodiment of the present disclosure, the ring oscillator further includes:

a delay measurement module 4, having input ends electrically connected to the first node N1 and the second node N2, and configured to acquire a first delay time of a signal at the first node N1 and a second delay time of a signal at the second node N2, and determine delay times of the first delay module and the second delay module according to the first delay time and the second delay time.

Since both the first delay time and the second delay time include the delay time of the oscillation module, the delay time of the oscillation module can be measured in advance before the delay times of the first delay module and the second delay module are measured. The delay time of the oscillation module can be measured without the connection of the delay modules. That is, the first output end of the oscillation module can be connected to the first input end of the oscillation module, and the second output end of the oscillation module can be connected to the second input end of the oscillation module. Then, the period and duty cycle of the output signal at each of the first output end and the second output end of the oscillation module are measured to determine the delay time of the oscillation module.

In an embodiment, the delay measurement module 4 determines the delay time of the ring oscillator according to an average value of the first delay time and the second delay time, and to a number of elements in each of the oscillation module, the first delay module and the second delay module, and then determines the delay times of the first delay module and the second delay module according to the delay time of the oscillation module measured in advance.

In another embodiment, the delay measurement module determines an average period according to a first period of the signal at the first node N1 and a second period of the signal at the second node N2, determines an average duty cycle according to a first duty cycle of the signal at the first node N1 and a second duty cycle of the signal at the second node N2, determines the delay time of the ring oscillator according to the average period, the average duty cycle and a number of elements in each of the oscillation module, the first delay module and the second delay module, and then determines the delay times of the first delay module and the second delay module according to the delay time of the oscillation module measured in advance.

Figure 7:
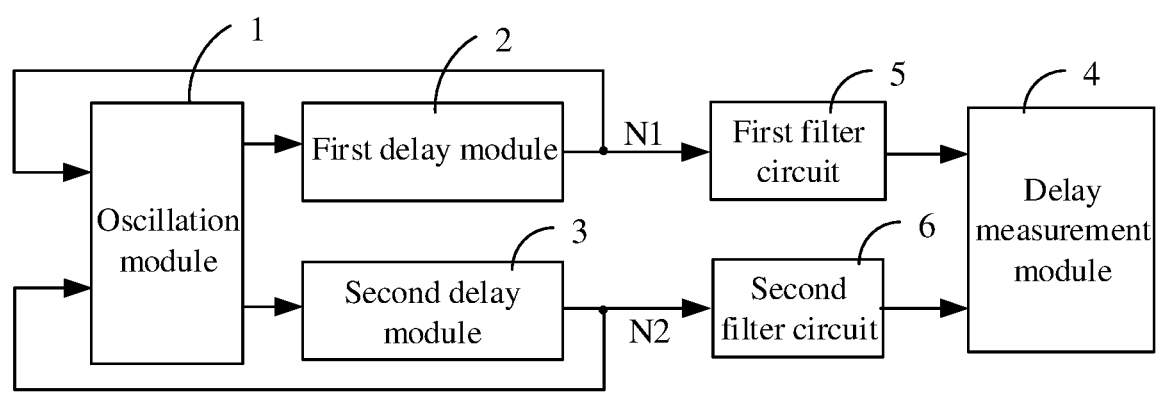
FIG. 7 is a schematic diagram of a ring oscillator according to another embodiment of the present disclosure.

FIG. 7 is a schematic diagram of a ring oscillator in another embodiment of the present disclosure.

Referring to FIG. 7, in an exemplary embodiment of the present disclosure, the ring oscillator further includes:

a first filter circuit 5, having an input end connected to the first node N1, and an output end connected to a first input end of the delay measurement module 4; and a second filter circuit 6, having an input end connected to the second node N2, and an output end connected to a second input end of the delay measurement module 4.

In the embodiment shown in FIG. 7, in order to measure the single-edge delay, an RC low pass filter circuit can be connected to each of the first node N1 and the second node N2. After the signals at the first node N1 and the second node N2 pass through the low pass filter circuit, the delay measurement module 4 can obtain an average value of periods of the signals at the first node N1 and the second node N2. The duty cycle of the signals at the first node N1 and the second node N2 can be calculated by the average value of the periods, and then the value of the single-edge delay is obtained.

It should be noted that although several modules or units of the apparatus for action performance are mentioned in above detailed description. But this division is not mandatory. Indeed, according to embodiments of the present disclosure, the features and functions of two or more modules or units described above may be embodied in one module or unit. Conversely, the features and functions of one module or unit described above may be further divided into multiple modules or units to be embodied.

Those skilled in the art, after considering the specification and practicing the invention disclosed herein, other embodiments of the present disclosure will readily contemplate. This application is intended to cover any variations, uses, or adaptations of the present disclosure that follow the general principles of the present disclosure and include common knowledge or techniques in the technical field not disclosed by the present disclosure. The specification and examples are regarded as exemplary only, the true scope and spirit of the disclosure being indicated by the claims.

INDUSTRIAL APPLICABILITY

According to the embodiments of the present disclosure, the oscillation function of the ring oscillator is implemented by using latches, it is possible to reduce the influence of a difference between a pull-up speed and a pull-down speed of the inverter during oscillation of the ring oscillator on the result of the delay measurement of the delay module. This in turn improves the accuracy of measuring a delay time of a device by the ring oscillator.

The invention claimed is:

1. A ring oscillator having a first delay loop and a second delay loop, an output end of the first delay loop being connected to a first node and an output end of the second delay loop being connected to a second node, the ring oscillator comprising:
   an oscillation module, disposed in the first delay loop and the second delay loop and including a first number of latches connected in series, wherein the oscillation module has two input ends and two output ends, and the two input ends are respectively connected to the first node and the second node;
   a first delay module, disposed in the first delay loop, and having an input end connected to a first one of the two output ends of the oscillation module and an output end connected to the first node; and
   a second delay module, disposed in the second delay loop, and having an input end connected to a second one of the two output ends of the oscillation module and an output end connected to the second node, wherein a structure of the second delay module is identical to a structure of the first delay module,
   wherein the first number of latches connected in series comprises:
      a first latch having a first input end connected to the first node, a second input end connected to the second node, a first output end connected to a first input end of a next latch, and a second output end connected to a second input end of the next latch; and
      a second latch having a first input end connected to a first output end of a previous latch, a second input end connected to a second output end of the previous latch, a first output end connected to the first delay module, and a second output end connected to the second delay module.

2. The ring oscillator of claim 1, wherein the first latch and the second latch are both SR latches.

3. The ring oscillator of claim 1, wherein the oscillation module further comprises:
   a first gate circuit, disposed in the first delay loop, and having a first input end connected to the first node, a second input end connected to a first enable signal and an output end connected to the first input end of the first latch, wherein the first gate circuit is configured to output an inversion signal of a signal at the first node when the first enable signal is in an enable state; and
   a second gate circuit, disposed in the second delay loop, and having a first input end connected to the second node, a second input end connected to a second enable signal and an output end connected to the second input end of the first latch, wherein the second gate circuit is configured to output an inversion signal of a signal at the second node when the second enable signal is in an enable state.

4. The ring oscillator of claim 2, wherein the oscillation module further comprises:
   a first gate circuit, disposed in the first delay loop, and having a first input end connected to the first node, a second input end connected to a first enable signal and an output end connected to the first input end of the first latch, wherein the first gate circuit is configured to output an inversion signal of a signal at the first node when the first enable signal is in an enable state; and
   a second gate circuit, disposed in the second delay loop, and having a first input end connected to the second node, a second input end connected to a second enable signal and an output end connected to the second input end of the first latch, wherein the second gate circuit is configured to output an inversion signal of a signal at the second node when the second enable signal is in an enable state.

5. The ring oscillator of claim 3, wherein one of the first gate circuit or the second gate circuit is an NAND gate and the other is an NOR gate; or, both the first gate circuit and the second gate circuit are NAND gates; or, both the first gate circuit and the second gate circuit are NOR gates.

6. The ring oscillator of claim 3, wherein the first node receives a first oscillation starting signal and the second node receives a second oscillation starting signal, the first oscillation starting signal and the second oscillation starting signal are inverse to each other.

7. The ring oscillator of claim 3, wherein the first number is equal to two, the first input end of the second latch is connected to the first output end of the first latch, and the second input end of the second latch is connected to the second output end of the first latch.

8. The ring oscillator of claim 1, wherein both the first delay module and the second delay module comprises a second number of inverters connected in series, the second number being an even number.

9. The ring oscillator of claim 1, further comprising:
   a delay measurement module, having input ends electrically connected to the first node and the second node, and configured to acquire a first delay time of a signal at the first node and a second delay time of a signal at the second node, and determine delay times of the first delay module and the second delay module according to the first delay time and the second delay time.

10. The ring oscillator of claim 9, wherein the delay measurement module determines the delay times of the first delay module and the second delay module according to an average value of the first delay time and the second delay time, and a number of elements in each of the oscillation module, the first delay module and the second delay module.

11. The ring oscillator of claim 9, wherein the delay measurement module determines an average period according to a first period of the signal at the first node and a second period of the signal at the second node, and determines an average duty cycle according to a first duty cycle of the signal at the first node and a second duty cycle of the signal at the second node, and determines the delay times of the first delay module and the second delay module according to the average period, the average duty cycle, and a number of elements in each of the oscillation module, the first delay module and the second delay module.

12. The ring oscillator of claim 9, further comprising:
   a first filter circuit, having an input end connected to the first node, and an output end connected to a first one of the input ends of the delay measurement module; and
   a second filter circuit, having an input end connected to the second node, and an output end connected to a second one of the input ends of the delay measurement module.

13. The ring oscillator of claim 1, wherein both the first delay module and the second delay module comprise one or more delay capacitor units, a first end of each of the one or more delay capacitor units being connected to an input end or an output end of any one of inverters, a second end of each of the one or more delay capacitor units being grounded, and each of the one or more delay capacitor units comprising at least a switch element and a delay capacitor connected in series.

14. The ring oscillator of claim 13, wherein both the first delay module and the second delay module comprise a rising edge delay circuit, or both the first delay module and the second delay module comprise a falling edge delay circuit, or both the first delay module and the second delay module comprise a double-edge delay circuit.

15. A ring oscillator having a first delay loop and a second delay loop, an output end of the first delay loop being connected to a first node and an output end of the second delay loop being connected to a second node, the ring oscillator comprising:
- an oscillation module, disposed in the first delay loop and the second delay loop and including a first number of latches connected in series, wherein the oscillation module has two input ends and two output ends, and the two input ends are respectively connected to the first node and the second node;
- a first delay module, disposed in the first delay loop, and having an input end connected to a first one of the two output ends of the oscillation module and an output end connected to the first node;
- a second delay module, disposed in the second delay loop, and having an input end connected to a second one of the two output ends of the oscillation module and an output end connected to the second node, wherein a structure of the second delay module is identical to a structure of the first delay module; and
- a delay measurement module, having input ends electrically connected to the first node and the second node, and configured to acquire a first delay time of a signal at the first node and a second delay time of a signal at the second node, and determine delay times of the first delay module and the second delay module according to the first delay time and the second delay time.

16. The ring oscillator of claim 15, wherein the delay measurement module determines the delay times of the first delay module and the second delay module according to an average value of the first delay time and the second delay time, and a number of elements in each of the oscillation module, the first delay module and the second delay module.

17. The ring oscillator of claim 15, wherein the delay measurement module determines an average period according to a first period of the signal at the first node and a second period of the signal at the second node, and determines an average duty cycle according to a first duty cycle of the signal at the first node and a second duty cycle of the signal at the second node, and determines the delay times of the first delay module and the second delay module according to the average period, the average duty cycle, and a number of elements in each of the oscillation module, the first delay module and the second delay module.

18. The ring oscillator of claim 15, further comprising:
- a first filter circuit, having an input end connected to the first node, and an output end connected to a first one of the input ends of the delay measurement module; and
- a second filter circuit, having an input end connected to the second node, and an output end connected to a second one of the input ends of the delay measurement module.

19. A ring oscillator having a first delay loop and a second delay loop, an output end of the first delay loop being connected to a first node and an output end of the second delay loop being connected to a second node, the ring oscillator comprising:
- an oscillation module, disposed in the first delay loop and the second delay loop and including a first number of latches connected in series, wherein the oscillation module has two input ends and two output ends, and the two input ends are respectively connected to the first node and the second node;
- a first delay module, disposed in the first delay loop, and having an input end connected to a first one of the two output ends of the oscillation module and an output end connected to the first node; and
- a second delay module, disposed in the second delay loop, and having an input end connected to a second one of the two output ends of the oscillation module and an output end connected to the second node, wherein a structure of the second delay module is identical to a structure of the first delay module,
- wherein both the first delay module and the second delay module comprise one or more delay capacitor units, a first end of each of the one or more delay capacitor units being connected to an input end or an output end of any one of inverters, a second end of each of the one or more delay capacitor units being grounded, and each of the one or more delay capacitor units comprising at least a switch element and a delay capacitor connected in series.

20. The ring oscillator of claim 19, wherein both the first delay module and the second delay module comprise a rising edge delay circuit, or both the first delay module and the second delay module comprise a falling edge delay circuit, or both the first delay module and the second delay module comprise a double-edge delay circuit.

* * * * *